United States Patent [19]

Stryjewski

[11] Patent Number: 5,479,169
[45] Date of Patent: Dec. 26, 1995

[54] MULTIPLE NEURAL NETWORK ANALOG TO DIGITAL CONVERTER FOR SIMULTANEOUSLY PROCESSING MULTIPLE SAMPLES

[75] Inventor: Wieslaw Stryjewski, Baton Rouge, La.

[73] Assignee: Louisiana Simchip Technologies, Inc., Baton Rouge, La.

[21] Appl. No.: 255,085

[22] Filed: Jun. 7, 1994

[51] Int. Cl.[6] .................................................. H03M 1/12
[52] U.S. Cl. ................................................... 341/156
[58] Field of Search .................................. 341/156, 155, 341/159, 144, 145, 141

[56] References Cited

U.S. PATENT DOCUMENTS

| | | |
|---|---|---|
| 4,533,903 | 8/1985 | Yamada et al. . |
| 4,559,522 | 12/1985 | Sekino et al. . |
| 4,807,168 | 2/1989 | Moopenn et al. . |
| 4,983,974 | 1/1991 | Mijuskovic . |
| 4,987,417 | 1/1991 | Buckland . |
| 4,994,806 | 2/1991 | Yun-Tae . |
| 5,049,882 | 9/1991 | Gorecki et al. . |
| 5,068,662 | 11/1991 | Guddanti et al. . |
| 5,086,299 | 2/1992 | Frigerio et al. . |
| 5,157,399 | 10/1992 | Kobayashi et al. ............ 341/163 |
| 5,179,631 | 1/1993 | Guddanti et al. . |
| 5,187,483 | 2/1993 | Yonemaru . |
| 5,194,867 | 3/1993 | Fisher . |
| 5,216,750 | 6/1993 | Smith . |
| 5,225,837 | 7/1993 | Hosotani et al. . |
| 5,258,760 | 11/1993 | Moody et al. . |
| 5,274,744 | 12/1993 | Yu et al. . |
| 5,274,745 | 12/1993 | Suzuoka . |
| 5,276,773 | 1/1994 | Knauer et al. . |

*Primary Examiner*—Brain K. Young
*Attorney, Agent, or Firm*—Hill, Steadman & Simpson

[57] ABSTRACT

An improved analog-to digital converter employs multiple sample and hold circuits to simultaneously supply multiple neural network A/D converters with samples of an analog input voltage so that the neural networks may simultaneously perform conversion of the different samples into a lower-order portion of the digital signals. A single fast A/D converter converts each sample into a higher-order portion of each digital signal.

14 Claims, 3 Drawing Sheets

5,479,169

1

MULTIPLE NEURAL NETWORK ANALOG TO DIGITAL CONVERTER FOR SIMULTANEOUSLY PROCESSING MULTIPLE SAMPLES

BACKGROUND OF THE INVENTION

1. Field of the Invention

This invention relates generally to the field of analog-to-digital converters and more particularly, this invention relates to analog-to-digital converters which employ multiple neural network converters for simultaneously processing more than one sample.

2. Description of the Prior Art

A wide variety of electronic circuit designs for analog-to-digital converters (referred to hereinafter as A/D converters) are known in the art. Designs vary from "flash" A/D converters which are capable of converting an analog voltage into a digital signal in essentially a single clock pulse, to various other designs which, though they are not as fast as flash converter designs, accomplish conversion with fewer components.

It is understood that in general, there is a trade-off between circuit size and speed in A/D converters. Conventional successive approximation A/D converters are relatively small in size, however, they require a relatively large number of clock cycles to provide an accurate digital representation of the input analog voltage. In contrast, flash A/D converters, as noted, produce an output in essentially only a single clock cycle, however, the circuitry for this design is much more complex. This design requires a resistor ladder network having $2^n+1$ resistors for $2^n$ stages, each of which includes a comparator in addition to decoding circuitry. Thus, the circuit requires a relatively large array of solid state devices for implementation and is impractical for certain applications.

While various designs in the prior art have attempted to achieve an ideal balance between circuit size and conversion speed, there remains a need in the art for A/D converter designs which provide high speed, accurate conversions with a minimum amount of circuitry.

Some more recent approaches have included adaptive referencing circuitry such as that disclosed in U.S. Pat. No. 4,987,417 invented by Buckland. In this design, the outputs from higher-order comparators feed forward through a resistor network to the voltage reference inputs of lower-order comparators. This forms a neural network for performing the conversion wherein the comparison voltage for a given comparator depends on the output of higher-order comparators. The conversion performed by this design, however, is not complete until each comparator produces a stable output. More recently, novel approaches to the design of the A/D converter neural network and latching of the outputs from the neural network have produced further advances. These A/D converter designs are disclosed in my co-pending U.S. patent application, Ser. No. 08/254,986, filed Jun. 7, 1994, titled Latched Neural Network A/D Converter, which is incorporated herein by reference.

The Latched Neural Network A/D Converter application discloses an A/D converter with a neural network which employs a register to store the outputs from a plurality of comparators after each step in the conversion process. The outputs from the register corresponding to higher-order bits are fed forward to a plurality of voltage sources such as either an R/2R resistor ladder network or the inputs of a plurality of D/A converters to alter the reference voltages for

2 the lower-order voltage comparators. This design produces a circuit with adaptive referencing capabilities which enables the use of fewer components to accomplish the conversion process. It is an improvement over the prior art neural network A/D converters because it provides greater flexibility in that it is easier to implement a converter with a greater number of stages. The prior art neural network A/D converters are of limited utility because increased circuit complexity is required for higher resolution and is therefore impractical for many high resolution applications.

The above-referenced application also discloses the ability to operate the improved circuitry with fewer neural network conversion steps while maintaining a high degree of accuracy. When operating the neural network A/D converter with a limited number of steps, the conversion may be considered complete after a fixed number of steps or after additional circuitry senses the conversion is complete for a given sample.

A further advance is disclosed in my co-pending application, Ser. No. 08/254,988, filed Jun. 7, 1994, titled, Combined Conventional/Neural Network Analog-to-Digital Converter, which is also incorporated herein by reference. This application describes an A/D converter which combines both conventional A/D converter circuitry and the improved neural network disclosed in application Ser. No. 08/254,986 to further improve conversion speed without sacrificing a corresponding amount of accuracy. In this application, a high speed conventional converter converts the higher-order bits and a neural network converts the lower-order bits. The increased conversion speed for the overall converter justifies the additional circuitry necessary for implementation of the high speed conventional converter. In a preferred embodiment, a flash A/D converter converts the higher-order bits of the analog signal. It is understood that any conventional A/D converter will provide satisfactory results, however, a flash converter allows realization of higher overall converter speeds. The results from the flash converter feed forward into the higher-order bits of a plurality of D/A converters which provide the reference voltages for a plurality of voltage comparators that determine the outputs for the lower order-bits. The outputs from the voltage comparators are applied to inputs of a register which temporarily stores the results. The outputs from the more higher-order outputs of the register feed forward into the D/A converters which provide the reference voltages for the lower-order comparators. This design forms a neural network for converting the lower-order bits wherein outputs from the conventional or high speed portion of the converter and the higher-order outputs from the neural converter feed-forward and determine the reference voltages for lower-order comparators in the neural network. In an alternate design, voltage sources other than D/A converters such as biased resistor ladder networks may be used to act as voltage sources for the comparators. This circuit can also use the technology disclosed in application Ser. No. 08/254,988 for limiting the number of neural network conversion steps necessary for completing conversion while maintaining conversion accuracy.

While these designs have improved the speed of A/D converters and/or decreased the circuitry necessary for implementation, there remains a need in the art for fast A/D converters with high resolution and limited circuit complexity. It is therefore an object of the present invention to provide a high resolution, high speed A/D converter which performs the conversion process with a limited number of steps.

SUMMARY OF THE PRESENT INVENTION

The present invention further increases the speed of A/D converters while maintaining a high degree of accuracy and limiting the number of circuit elements necessary for implementation. In this design, a plurality of voltage samples are simultaneously processed in separate neural networks to further increase the speed of the overall A/D converter.

A first sample and hold unit provides a stable output voltage which is the value of the analog input voltage at a first point in time. The output from the sample and hold unit is fed into the input of a fast A/D converter. The fast A/D converter may be of any conventional A/D converter design, however, in the preferred embodiment of the present invention, the fast A/D converter is a flash type converter. The flash converter converts the higher-order bits of the first sample in a single clock pulse. The output from the fast A/D converter is fed into the inputs first and second registers or latches. Only one of these registers is triggered to temporarily store the results from the fast converter. The outputs from the first latch which receives the outputs from the fast A/D converter are applied to the inputs of a first neural network as well as the inputs of a first output buffer. The first output buffer provides inputs to a multiplexer which alternately switches between the first output buffer and a second output buffer depending on which output buffer has most recently received a converted signal.

A second sample and hold unit provides the reference voltage for the first neural network. Both the first and second sample and hold units are initially triggered at the same point in time so that they each provide a stable output voltage which is the value of the analog input voltage at the same given point in time.

The first neural network uses the outputs from the first latch to set the higher-order bits of digital-to-analog converters which provide the reference voltages for a plurality of comparators within the first neural network. The outputs from the first latch also define the higher-order bits of the overall A/D converter output for the first sample. The output from the first latch and neural network feed into the first output buffer which also feeds the inputs of a multiplexer that provides the outputs for the overall A/D converter as noted.

During the second clock cycle, the first sample and hold unit is triggered for a second time while the second sample and hold is not triggered and maintains its original output voltage. During this clock cycle, a third sample and hold unit is also triggered so that the first and third sample and hold units now provide a stable output voltage which is the value of the input analog voltage at the same second point in time. The second sample and hold unit's output remains unchanged until the first neural network completes conversion of the lower-order bits. The neural network may complete conversion in a fixed number of conversion steps or clock cycles or alternatively additional comparator circuitry may be used to determine when the neural network is stable and conversion is complete.

During the next clock cycle, the fast A/D converter converts the higher-order bits of the second analog voltage input sample. This is applied to the inputs of the second latch, whose output is applied to the input of a second neural network and second output buffer. The output of the fast A/D converter has now also determined the higher-order output bits of the overall circuit for the second sample. Conversion of the second sample is complete when the second neural network completes conversion of the lower order bits.

By using the two separate neural networks to simultaneously process the lower order bits of separate voltage samples, the analog-to-digital conversion process is completed more rapidly. The first neural network can proceed to the third sample of the analog input voltage as soon as the first neural network completes conversion of the lower-order bits of the first sample. The separate neural networks convert subsequent alternate samples in a similar fashion. Thus, simultaneous processing is accomplished.

DETAILED DESCRIPTION OF THE PREFERRED EMBODIMENTS

Figure 1:
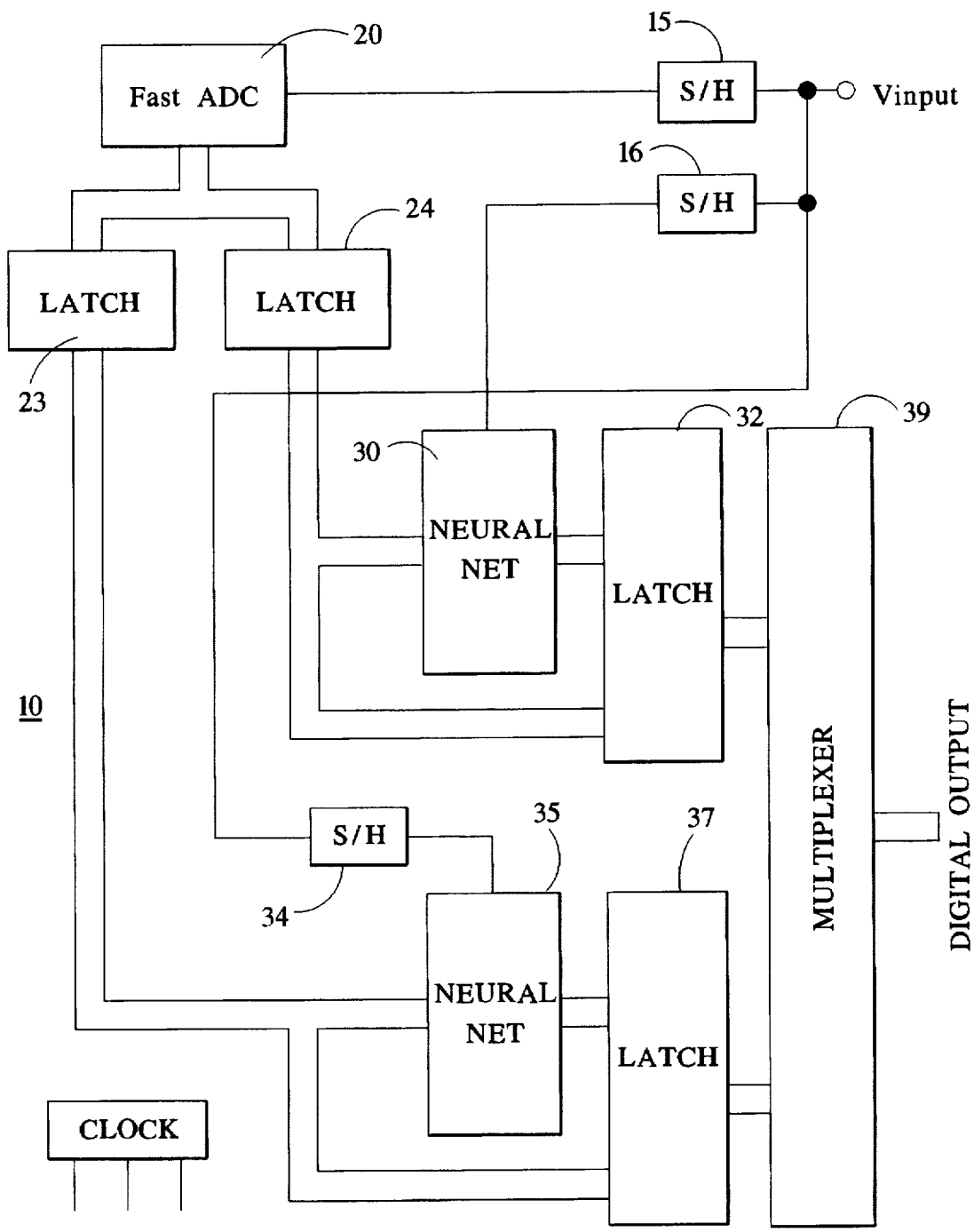
FIG. 1 illustrates a block diagram of the A/D converter circuit of the present invention.

FIG. 1 illustrates a block diagram of a preferred embodiment of the A/D converter circuit of the present invention which is shown generally at 10. In this circuit, multiple sample and hold units provide stable output voltages of different samples from the input analog voltage waveform which are applied to separate neural networks thus allowing simultaneous processing of the input analog voltage signal so that conversion of the signal may be more rapidly completed.

First and second sample and hold units 15, 16 are initially triggered at the same point in time so that they provide stable outputs for a sample from the analog input voltage vin. The output from sample and hold unit 15 is applied to the inputs of a conventional fast A/D converter 20. In a preferred embodiment, the conventional fast A/D converter is a flash A/D converter in order to realize the greatest benefit from increased speed at the front end. It is recognized that any A/D converter design may be used for this circuit, even one which incorporates a neural network to perform the conversion. Higher speed converter designs, however, provide best results for this first converter.

The flash A/D converter 20 converts the higher-order bits of the first sample in the next clock cycle. The outputs from the flash A/D converter feed first and second flash converter output latches 23, 24. Only the second latch 24 is triggered to provide the result from the flash A/D converter 20 on its outputs. The outputs from latch 24 are applied to the inputs of a first neural network 30 and an output buffer latch 32. The outputs from flash A/D converter 20 define the higher-order output bits for the overall converter and latch 24 maintains this digital value on its outputs until neural network 30 completes conversion of the lower-order bits of the first sample. Sample and hold unit 16 provides the reference voltage for neural network 30 during conversion of the lower-order bits. The details relating to operation of neural network 30 are described below.

The third clock cycle triggers first sample and hold unit 15 and a third sample and hold unit 34. Sample and hold units 15 and 34 now provide a stable output voltage which is the value of a second sample from the input analog voltage at a second point in time. The flash A/D converter 20 converts the output from sample and hold unit 15 into the higher-order bits of the digital signal representative of the second voltage sample. Latch 23 is triggered to provide this digital signal on its outputs. Latch 24 is not triggered and maintains the original digital signal representing the higher-order bits of the first analog input-voltage sample. The outputs from latch 23 are applied to the inputs of a second neural network 35 and second output buffer latch 37. Neural network 35 converts the lower-order bits of the second sample of the analog input voltage. Sample and hold unit 34 provides the reference voltage for the second neural network 35. Operation of the conversion performed in neural network 35 is described in greater detail below.

When the first Neural Network 30 completes conversion of the lower order bits from the first sample, latch 32 is triggered to provide the resultant digital signal on its outputs. First and second sample and hold units 15 and 16 are also triggered with the same clock pulse so that they may provide the next sample of the analog input voltage. It is understood that sample and hold unit 16 is designed to provide a change at its outputs on the trailing edge of its trigger so that triggering of subsequent samples will not interfere with the outputs from the Neural Network 30 before they are latched into the output buffer 32. The output from sample and hold unit 15 may change on the leading edge of its trigger because it cannot affect the conversion of the lower order bits once its output is held on the output of latch 23 or 24. Multiplexer 39 provides a digital output signal representative of the first voltage sample from latch 32 after latch 32 provides a valid output. Multiplexer 39 subsequently provides an output from latch 37 after Neural Network 35 completes conversion of the lower-order bits of the second analog input voltage sample and latch 37 provides valid data on its output. Multiplexer 39 continues to change its output by alternately switching its input between latch 32 and latch 37. Multiplexer 39 maintains this order of alternate output selection so that a digital signal representing a particular voltage sample is provided as an output for the overall converter in the order that the samples are received.

The neural networks thus operate simultaneously on subsequent samples to achieve higher overall conversion speeds. It is understood that the example illustrated in FIG. 3 can be varied greatly to achieve similar results. For instance, three or more neural networks could operate simultaneously to provide similar results. Additionally, the ratio between the number of bits converted with the neural network and flash or fast converter may also be varied. The only requirement is that the multiplexer provide an output representative of the voltage input samples in the order in which they are received.

Figure 2:
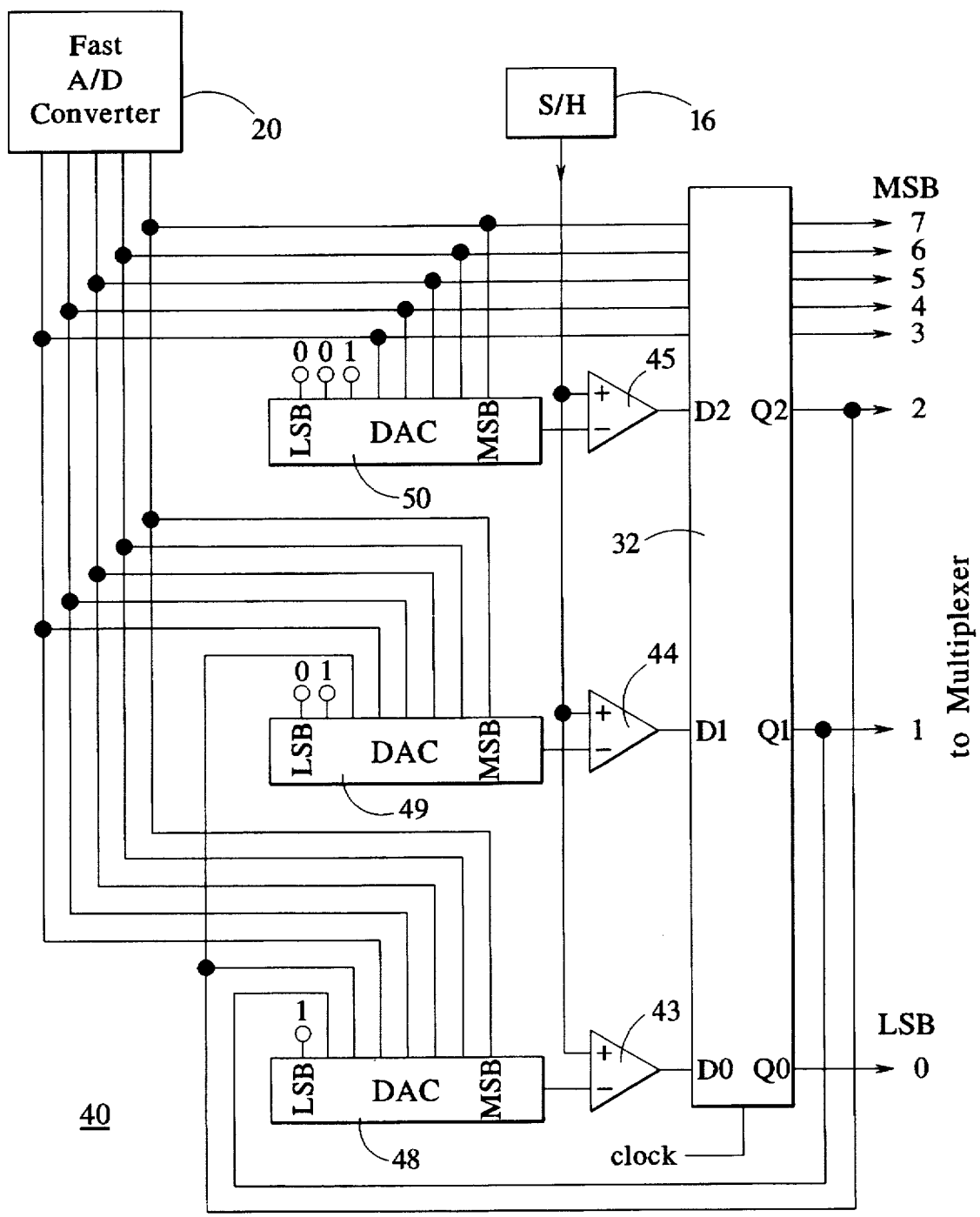
FIG. 2 illustrates the details of the neural network circuitry for performing the conversion of the lower-order bits for the analog-to-digital circuit illustrated in FIG. 1.

FIG. 2 illustrates the details of the conversion process of performed by a neural network which exemplifies those set forth in FIG. 1. The neural network is shown generally at 40. Sample and hold unit 16 provides an output reference voltage which feeds each of the positive inputs of voltage comparators 43–45. There is one comparator for each bit which is converted via the neural network. Outputs from the comparators 43–45 feed into the corresponding inputs of latch or register 32. The outputs from all but the lowest-order comparator feed forward to D/A converters 48 and 49 which set the reference voltages for the remaining lower-order comparators. The inputs to the D/A converters are considered to be input control points. The voltage applied to these points adjusts the reference voltages for the comparators. The circuit thus forms a neural network in which the reference voltages of the lower-order comparators are determined by the outputs from higher-order comparators.

The output from the LSB+N comparator feeds forward to the LSB+N input of each of the lower-order D/A converters. The input bit of each D/A converter which corresponds to the latched-neural network converter output for which the D/A converter provides a voltage reference is set to logical "1" while the remaining lower-order inputs of the D/A are fixed at logical "0" (i.e. the LSB input bit for the D/A converter which provides the reference voltage for the LSB comparator is set to logical "1" and none of the input bits on this D/A converter are set to logical "0"; the LSB+1 input bit for the converter which sets the reference voltage for the LSB+1 comparator is set to logical "1" while its LSB input is set to logical "0" etc.).

Operation of the circuit illustrated in FIG. 2 will be described with reference to the following example. In this example, D/A converters 48–50 are capable of supplying an output voltage of between 0 and 25.5 volts in 0.1 V increments. It is assumed initially, that all digital outputs are logical "0". Thus, the initial threshold of comparator 43 is 0.1 V, the initial threshold of comparator 44 is 0.2 V and the initial threshold of comparator 45 is 0.4 V. The analog input voltage to be converted is 11 V. Sample and hold unit 16 provides a stable 11 V output which is applied to each of the positive inputs of comparators 43–45.

Another sample and hold unit (not shown) applies its output to the input of fast A/D converter 20. The fast A/D converter converts the higher-order portion in a single clock cycle and applies this output to D/A converters 48–50. D/A converters 48–50 convert this digital signal and provide new reference voltages for the comparators. The reference voltage for comparator 43 is now 10.5 volts; the reference voltage for comparator 44 is 10.6 Volts and the reference level for comparator 45 is now 10.8 volts.

After the next clock cycle, the output from the register corresponding to comparator 45 changes to logical 1 (because 11>10.8); the output from the register corresponding to comparator 44 (LSB+1) changes to logical "1" because (11>10.6); and the output from the register corresponding to the output from comparator 43 changes to logical "1" (because 11>10.5).

The resulting changes are applied to the D/A converters 48–50. The threshold level of inputs to the comparators change based on changes at the inputs to the corresponding D/A converters. The threshold of comparator 45 remains unchanged at 10.8 V (this value does not depend on the lower-order output from the register); the threshold of comparator 44 is now 11 V; and the threshold of comparator 43 is 11.1 V. The output from comparator 45 remains logical "1" (because 11>10.8); the output from comparator 44 remains "1" (because 11=11); and the output from comparator 43 changes to 0 (because 11<11.1). Conversion of this signal is now complete as this is the value of the converted signal.

While conversion of an analog input voltage by the neural network portion of the converter will always be complete in n clock cycles where n is the number of bits converted by the neural network, it has been found that valid outputs are often available much earlier. Conversion speeds can be dramatically increased without a corresponding decrease in conversion accuracy.

Figure 3:
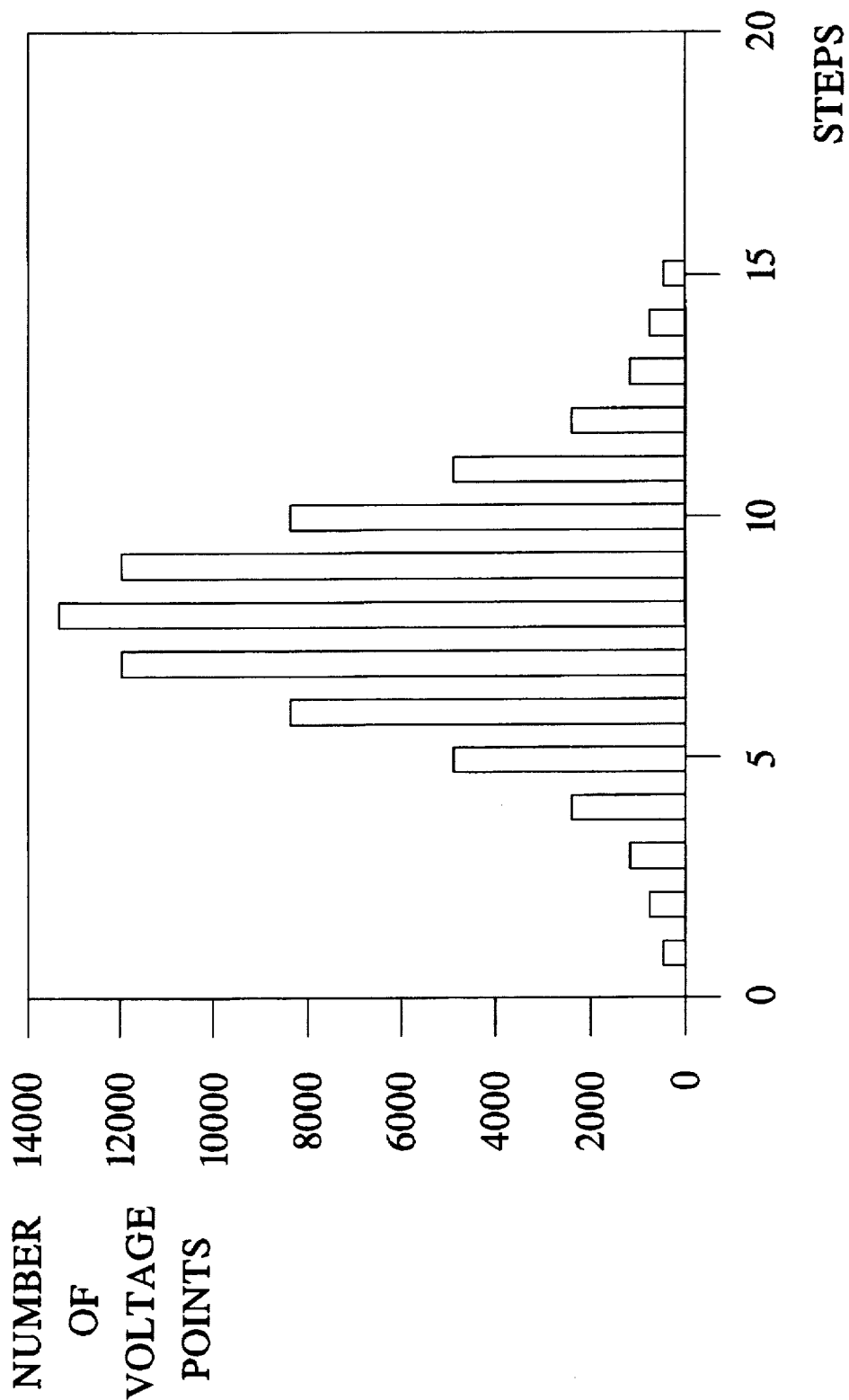
FIG. 3 illustrates the Gaussian-like distribution of the number of neural network conversion steps required to convert a ramp of $2^{16}$ voltage points with a 16-bit neural network.

FIG. 3 illustrates the number of steps required to accurately convert a ramp of $2^{16}$ voltage points with a 16-bit neural network converter of similar design to the embodiments described above. It is understood that the circuits described above can provide increased resolution simply by the addition of similar stages in the neural network. FIG. 3 indicates that the number of neural network steps required to perform accurate conversions using a 16-bit neural network converter on a ramp of $2^{16}$ voltage points is a Gaussian-like distribution with 8 steps being the most frequent number of steps required to accurately perform the conversion.

It is recognized therefore that performing 16 conversion steps with a 16-bit converter is usually unnecessary. Accurate conversions can generally be completed in a few steps. It is recognized that an average of only n/2 steps are required to perform accurate conversions where n is the number of bits converted with the neural network. The recognition that fewer than n steps are usually required to convert a given voltage for an n-bit converter may be used to further increase conversion speeds. One technique for decreasing the number of steps is to compare the current outputs from the neural network with the outputs of the previous step. If the outputs remain unchanged, the conversion data is valid and the sample and hold unit may be cycled for converting another voltage value. When identical results appear on the output from the register, it is known that the neural network is stable, the results are valid, and a new voltage may be converted. This is due to the fact that if the outputs remain unchanged, the reference levels of all of the comparators will also remain unchanged. Any technique for comparing the outputs may be used including the use of voltage comparators.

Rather than comparing current results with previous results for determining when conversion is complete, the circuits of the present invention may be used to provide conversion results in a predetermined number of steps after conversion is initiated. Although it is likely that errors will occur in the lower-order output bits occasionally, it is believed that these occurrences are statistically insignificant and are acceptable for many applications.

In one final application, the two techniques could be combined whereby a microprocessor controls the conversion process to further increase the speed of conversion. It is recognized that the stability of the outputs from the register increase with an increasing number of conversion steps. Furthermore, the 10 likelihood that a given register output is stable, decreases with decreasing significance of the particular output bit. The processor could be programmed to consider the output valid when either a given number of conversion steps have been performed or when only one or two lower-order bits have the potential for changing.

The distribution of the number of steps required for complete conversion shown in FIG. 3 was based on the conversion of voltage values with all register outputs initially set to logical "0". Computer simulations indicate that even further savings in the number of steps will be realized if the results from previous conversions are used as a starting point for subsequent conversions, This is due to the fact that the converter essentially starts with the preceding conversion result for converting the next value. Simulated results indicate that in may instances only 2 steps are required to perform complete conversion.

The present invention is subject to many variations, modifications and changes. In detail, it is intended that all matter described throughout the specification and shown in the accompanying drawings be considered illustrative only. Accordingly, it is intended that the invention be limited only by the spirit and scope of the appended claims.

I claim as my invention:

1. A method for converting an analog input voltage into a digital signal comprising the steps of:

providing a first output voltage approximately equal to the analog input voltage at a first point in time;

converting the first output voltage into a higher-order portion of a first digital output signal with a first A/D converter circuit;

converting the first output voltage into a lower-order portion of the first digital output signal with a first neural network A/D converter;

providing, a second output voltage approximately equal to the analog input voltage at a second point in time while performing said step of converting the first output voltage into a lower-order portion of the first digital signal;

converting the second output voltage into a higher-order portion of a second digital output signal with the first A/D converter circuit;

converting the second output-voltage into a lower-order portion of the second digital output signal with a second neural network A/D converter; and repeating the preceding steps to provide a plurality of first and second digital output signals.

2. The method of converting an analog input voltage into a digital signal of claim 1, wherein the first A/D converter circuit is a flash A/D converter.

3. The method of converting an analog input voltage into a digital signal of claim 1, wherein said first A/D converter circuit is a delta sigma A/D converter.

4. The method of converting an analog input voltage into a digital signal of claim 1, wherein said first A/D converter circuit is a charge distribution A/D converter.

5. The method of converting an analog input voltage into a digital signal of claim 1, wherein the higher-order portion of the first and second digital output signals contains more bits than the lower order portion of the first and second digital output signals.

6. The method for converting an analog input voltage into a digital signal of claim 1 further comprising the steps of:

comparing the results of previous and subsequent neural network conversion steps of the first neural network A/D converter to determine when conversion of the lower-order portion of the first digital output signal is complete.

7. The method for converting an analog input voltage into a digital signal of claim 1 further comprising the steps of:

performing a predetermined number of neural network conversion steps with the first neural network A/D converter to determine when conversion of the lower-order portion of the first digital output signal is complete.

8. A circuit for converting an analog input voltage into a digital signal comprising:

first and second sample and hold units for providing respective first and second output voltages approximately equal to the analog input voltage at respective first and second points in time;

a first A/D converter means for converting the first and second output voltages into a higher-order portion of first and second digital output signals; and first and second neural network converter means for converting the first and second output voltages into a lower-order portion of the first and second digital output signals.

9. The circuit for converting an analog input voltage into a digital signal of claim 6, further comprising:

a third neural network converter means for converting a third output voltage into a lower-order portion of a third digital output signal.

10. The circuit for converting an analog input voltage into a digital signal of claim 6, wherein the first A/D converter means is a flash A/D converter.

11. The circuit for converting an analog input voltage into a digital signal of claim 6, wherein the first A/D converter means is a delta-sigma A/D converter.

12. The circuit for converting an analog input voltage into a digital signal of claim 6, wherein the first A/D converter means is a charge distribution A/D converter.

13. The method for converting an analog input voltage into a digital signal of claim 1, wherein higher-order outputs of the first neural network A/D converter exclusively feed forward to alter lower-order voltage reference levels within the first neural-network A/D converter.

14. The circuit for converting an analog input voltage into a digital signal of claim 8, wherein higher-order outputs of the first neural network converter means exclusively feed forward to alter lower-order voltage reference levels within the first neural-network converter means.

* * * * *